United States Patent [19]

Newman

[11] Patent Number: 4,899,185

[45] Date of Patent: Feb. 6, 1990

[54] HIGH DENSITY TAPE-AUTOMATED BONDING (TAB) OF ELECTRONIC COMPONENTS

[75] Inventor: David A. Newman, Rochester, N.Y.

[73] Assignee: Eastman Kodak Company, Rochester, N.Y.

[21] Appl. No.: 397,816

[22] Filed: Aug. 24, 1989

[51] Int. Cl.[4] .......................................... G01D 15/00
[52] U.S. Cl. ...................................... 346/155; 346/160
[58] Field of Search ................... 346/155, 139 C, 160, 346/150, 153.1; 358/300; 400/119

[56] References Cited

U.S. PATENT DOCUMENTS 4,797,895  1/1989  Kokubo et al. ...................... 346/160
4,803,565  2/1989  Teshigawara et al. .............. 346/160

Primary Examiner—Arthur G. Evans
Attorney, Agent, or Firm—Armin B. Pagel

[57] ABSTRACT

A plurality of narrowly spaced electrodes of an electronic device are connected to a corresponding plurality of similarly spaced electrodes of another electronic device by two superimposed mutually separated layers of wires. The lower wires of the lower layer are bonded to outer bonding pads of alternate device electrodes that are located in a first row near the corresponding edges of the respective devices. Inner bonding pads of the other device electrodes are located in a second row further from the corresponding device edges between the outer pad electrodes and are bonded to the wires of the upper layer, the connecting ends of which extend beyond the corresponding ends of the lower wires.

5 Claims, 1 Drawing Sheet

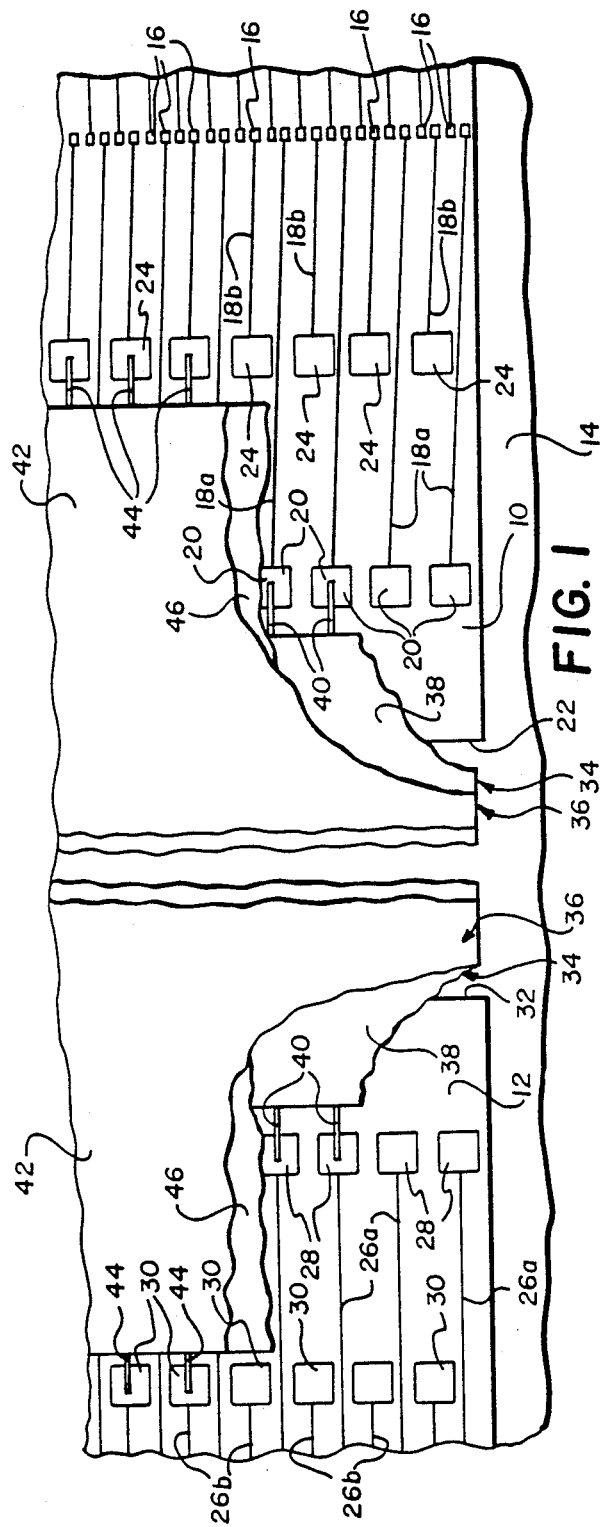
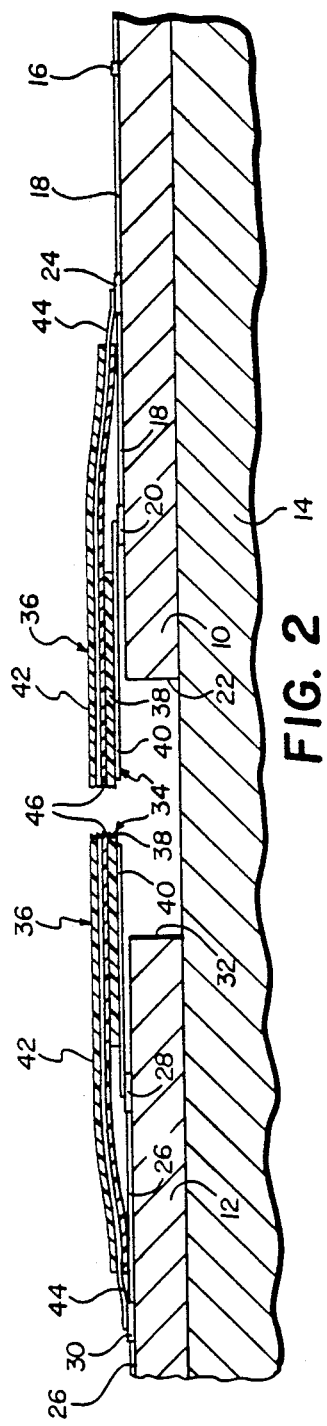

HIGH DENSITY TAPE-AUTOMATED BONDING (TAB) OF ELECTRONIC COMPONENTS

BACKGROUND OF THE INVENTION

1. Field of the Invention

The invention relates to electrically connecting a plurality of respective closely spaced electrodes of two electronic devices and, more particularly, to electrically connecting the electrodes of light-emitting diode (LED) array chips to corresponding electrodes of an electronic control circuit.

2. Description Relative to the Prior Art

An LED array chip of the type used in an optical printhead comprises of row of uniformly spaced LED sites that can be individually energized to expose a photoreceptor or other image-receiving medium to reproduce an image pattern. The individual light sources are very small and closely spaced, e.g., 160 or more per centimeter, and a bonding pad of an energizing electrode for each LED source must be connected to a bonding pad of a corresponding electrode of a driver circuit. Typically, two driver chips straddle an array chip and electrodes from the LED sites extend alternately toward opposite edges of the LED chip to allow bonding to corresponding electrodes of the adjacent driver chip. Accordingly, if the LED array chip has 160 LED sites per centimeter, the bonding pads of 80 electrodes extend along each edge of the LED array chip and must be bonded individually to corresponding bonding pads of the adjacent driver circuit. The center-to-center distance of the electrode bonding pads is, therefore, on the order of 0.125 millimeters. Conventional wire bonding techniques, which are well known in the art, can be used to connect bonding pads with this spacing, but such spacing is close to the practical limits of this technique. U.S. Pat. No. 4,524,372, issued on June 18, 1985, shows the concept of staggering bonding pads or a conductor array to provide slightly more room for bonding each wire, but this bonding pad arrangement is not employed on the diode array chip itself, and there is no suggestion of employing such a staggered pad arrangement to allow the use of two different superimposed layers of connections. As disclosed in commonly assigned U.S. patent application Ser. No. 228,641, entitled "LED ARRAY PRINT-HEAD WITH TAB BONDED WIRING", filed on Aug. 5, 1988, the use of tape-automated bonding (TAB) bonding techniques improves the ability to connect such closely spaced electrode bonding pads and avoids the potential short circuiting problem, but these techniques also become impractical when the bonding pad pitch becomes much smaller than about 0.075 millimeter. Accordingly, because it is now possible to produce LED array chips with diode sites significantly in excess of 160 per centimeter, the limit to the resolution of the array or the printhead is dictated by limitations on the ability to bond the LED electrodes to the corresponding electrodes of the driver chips.

SUMMARY OF THE INVENTION

In accordance with the present invention, a plurality of narrowly spaced electrodes of an electronic device are connected to a corresponding plurality of similarly spaced electrodes of another electronic device by two superimposed layers of wires which, preferably, comprise TAB wires that are supported and mutually insulated by plastic web material. The wires of the lower layer are bonded to outer bonding pads of alternate device electrodes that are located near to the corresponding edges of the respective devices. Inner bonding pads of the other electrodes are located further from the corresponding device edges between the outer pad electrodes and are bonded to the upper layer wires, the connecting ends of which extend beyond the corresponding ends of the lower TAB wires. As illustrated in the preferred embodiment of the invention, the two rows of bonding pads are spaced apart by at least several times the spacing between adjacent pads in each row so that the upper layer of wires can extend well beyond the ends of the lower wire layer, thus insuring positive insulation between the two layers of TAB connector wires. Accordingly, all of the bonding wires are positively maintained out of contact with each other and the spacing of both the inner and outer bonding pads and of the connector elements bonded thereto are greater than the spacing between adjacent electrodes, thereby allowing the individual bonding pads to be wider than that spacing. However, this pad spacing feature is not necessary if two layers of conventional wire bonding connectors are used. More particularly, the foregoing structure is employed in a preferred embodiment of the invention for electrically connecting the electrodes of light-emitting diode array chips to corresponding elements of an electronic control circuit in an LED printer head.

Various means for practicing the invention and other advantages and novel features thereof will be apparent from the following detailed description of an illustrative preferred embodiment, reference being made to the accompanying drawings in which:

BRIEF DESCRIPTION OF THE DRAWINGS

FIG. 1 is a greatly enlarged fragmentary plan view showing a portion of an LED array chip connected to a portion of a driver chip in accordance with a preferred embodiment of the invention by double layer TAB wiring means; and FIG. 2 is a cross-sectional edge view of the structure depicted in FIG. 1.

DESCRIPTION OF THE ILLUSTRATIVE PREFERRED EMBODIMENT

FIG. 1 of the accompanying drawings shows, greatly enlarged, a portion of an LED diode array chip 10 and a corresponding portion of a driver chip 12, both of which are mounted to a support plate 14 of an LED printhead assembly. The array chip 10 includes, along its longitudinal center line, a plurality of very small, uniformly spaced light-emitting sites 16. Each such site is electrically connected to the support plate 14 through the body of the chip 10 and is electrically energized through a corresponding electrode 18a or 18b. The electrodes 18a and 18b connected to alternate ones of the diode sites 16 extend in opposite directions from the row of diode sites and vary slightly in width to maintain constant impedance but are located generally symmetrically at either side of the row of sites along the center line of the chip, only a portion of which is depicted in the drawings.

Alternate ones of the electrodes extending from each side of the row of diode sites are relatively long as shown at 18a and extend to outer bonding pads 20 located in a row relatively near the corresponding edge 22 of the chip. Between the long electrodes associated with pads 20, the shorter intermediate electrodes 18b terminate in inner bonding pads 24, located between the adjacent long electrodes and aligned in a row further from the corresponding edge of the chip than are the bonding pads 20. As is apparent from FIG. 1, this arrangement allows the bonding pads along each of the pad rows to be wider than the spacing between the electrodes adjacent the diode sites. In other words, each bonding pad is substantially wider than would be possible if all the pads were located in a single row.

The driver chip 12, which is spaced from edge 22 of array chip 10, is provided with alternate long electrodes 26a and with shorter intermediate electrodes 26b provided with respective bonding pads 28 and 30 disposed in the same manner just described; i.e. with outer bonding pads 28 on the longer electrodes 26a located in a row relatively near the corresponding edge 32 of the driver chip and with the alternate inner bonding pads 30 or short intermediate electrodes 26b aligned in a row further from the edge of the driver chip.

In accordance with the invention, each bonding pad of the LED array chip 10 is electrically connected to the similarly located corresponding pad of the driver chip 12 by means of two TAB elements 34 and 36, each of which comprises a sheet or web of plastic supporting an array of generally parallel conductive wires that extend beyond the ends of the plastic material. The lower TAB element 34 comprises plastic web 38 with wires 40 adhered to its lower surface and extending beyond the ends of the plastic material in alignment with the corresponding outer bonding pads 20 and 28. In FIG. 1, for example, wires 40 extend along the lower face of the lower TAB web 38 and beyond the ends of that web so that their projecting ends lie atop the respective bonding pads 20 and 28.

With the lower TAB element positioned as shown, by appropriate conventional positioning means, the ends of its wires are bonded to the respective mounting pads of the array chip and the driver circuit by conventional means, e.g. thermal compression bonding, thermosonic bonding, laser bonding, etc.

After the lower TAB element has been bonded, the upper TAB element 36 is positioned as shown in FIG. 1. This element is similar to element 34 comprising a plastic web 42 carrying conductive wires as shown at 44, which connect the inner bonding pads 20 of the array chip to the corresponding inner bonding pads 28 of the driver chip. Additionally, the lower face of the upper TAB element, between the ends of web 42, is provided with an insulative coating 46, such as a dry mask material to prevent possible short circuiting of wires 44 to the outer bonding pads or the electrodes connected thereto. Such an insulating layer may also be applied to the lower tab element if a similar short circuiting possibility exists, but is not essential in the illustrated embodiment. Although the wires at the upper and lower TAB elements are depicted in staggered relation to each other, the wires of the two wire layers can be mutually aligned or can cross each other because of the insulation between those two wire layers.

With the upper TAB element positioned as shown, by conventional means, the end wires of that element are bonded to the respective bonding pads, as previously described, thus completing the assembly operation.

Although the double layer TAB structure described above uses two separate superimposed TAB elements, it should be understood that a single double layer element could be employed, in which case openings for windows could be provided through the plastic material surrounding the ends of the lower wires and between the adjacent electrodes of the adjacent outer pad electrodes to provide access to those wire ends for bonding them to the corresponding outer bonding pads of the two electronic devices. Also, it should be understood that the invention can be practiced by using the TAB material to provide a support frame for the electronic components, as disclosed in commonly assigned U.S. patent application Ser. No. 228,641 entitled LED ARRAY PRINTHEAD AND METHOD OF MAKING SAME, filed on Aug. 5, 1988. Furthermore, although the preferred embodiment of the invention uses TAB bonding means, if the bonding pads of the two electrically connected devices are close to each other, the invention can be employed with conventional wire bonding means rather than with TAB means. In that case, the outer bonding pads are connected first with relatively short bonding wires and the inner bonding pads are then connected with longer bonding wires that arch above the shorter wires of the outer bonding pads.

The invention has been described with particular reference to an illustrative preferred embodiment, but variations and modifications are possible within the spirit and scope of the invention as defined by the following claims.

What is claimed is:

1. An electronic assembly including two electronic devices provided with mutually corresponding, narrowly spaced, generally parallel first and second alternating electrodes provided with respective bonding pads, said bonding pads of said first electrodes of each device being aligned in a first row near one edge thereof and bonding pads of said second electrodes being aligned between said alternate electrodes in a second row farther from said edge, and, first and second superimposed mutually separated layers of spaced bonding wires, said wires of said first layer connecting said first electrodes of one of said devices to corresponding first electrodes of the other of said devices, said wires of said second layer being longer than said wires of said first layer and connecting said second electrodes of one of said devices to the corresponding second electrodes of the other of said devices.

2. The invention defined by claim 1 in which said layers of wires are supported and mutually insulated by plastic web material.

3. The invention defined by claim 1 in which said electronic assembly is a light-emitting diode printhead and said two electronic devices are respectively a light-emitting diode array chip and a driver chip.

4. The invention defined by claim 1 in which said bonding pad are wider than the spacing between said first and second electrodes.

5. The invention defined by claim 1 in which said rows are spaced apart by at least several times the spacing of adjacent bonding pads in either of said rows.

* * * * *